(12) United States Patent
Wang

(10) Patent No.: US 10,757,354 B2
(45) Date of Patent: Aug. 25, 2020

(54) PIXEL SENSING CIRCUIT AND DRIVING METHOD THEREOF, IMAGE SENSOR AND ELECTRONIC DEVICE

(71) Applicants: Beijing BOE Technology Development Co., Ltd., Beijing (CN); BOE Technology Group Co., Ltd., Beijing (CN)

(72) Inventor: Zhiliang Wang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/515,276

(22) Filed: Jul. 18, 2019

(65) Prior Publication Data
US 2020/0162687 A1    May 21, 2020

(30) Foreign Application Priority Data
Nov. 20, 2018    (CN) .......................... 2018 1 1383403

(51) Int. Cl.
*H04N 5/369*    (2011.01)
*H04N 5/351*    (2011.01)
*H01L 27/146*    (2006.01)

(52) U.S. Cl.
CPC .......... *H04N 5/3698* (2013.01); *H04N 5/351* (2013.01); *H01L 27/14612* (2013.01); *H01L 27/14636* (2013.01)

(58) Field of Classification Search
CPC .... H04N 5/3698; H04N 5/351; H04N 5/2253; H04N 5/235; H04N 5/335; H01L 27/14612; H01L 27/14636
See application file for complete search history.

(56) References Cited

U.S. PATENT DOCUMENTS

| 8,928,792 | B1* | 1/2015 | Hynecek | H04N 5/3745 348/308 |
| 10,412,326 | B2* | 9/2019 | Geurts | H04N 5/3742 |
| 2006/0109362 | A1* | 5/2006 | Kim | H04N 5/365 348/308 |

(Continued)

*Primary Examiner* — Chiawei Chen
(74) *Attorney, Agent, or Firm* — Westman, Champlin & Koehler, P.A.

(57) ABSTRACT

The embodiments of the present disclosure provide a pixel sensing circuit. The photoelectric conversion sub-circuit is configured to collect an incident light, and generate an electrical signal based on the incident light collected, so as to charge the signal collection point. The resetting sub-circuit is configured to write a first power supply voltage from the first power supply terminal to the signal collection point. The compensation and pulling-up sub-circuit is configured to: obtain a threshold voltage of the conversion transistor; generate a compensation voltage according to the threshold voltage; write the compensation voltage to the signal collection point; pull up the voltage at the signal collection point. The selection sub-circuit is configured to control the connection between the first electrode of the conversion transistor and an image processor. The conversion transistor is configured to output the current signal according to the voltage at the signal collection point.

10 Claims, 3 Drawing Sheets

(56) References Cited

U.S. PATENT DOCUMENTS

| | | | |
|---|---|---|---|
| 2006/0227233 A1* | 10/2006 | Fossum | H01L 27/14609 348/308 |
| 2009/0153714 A1* | 6/2009 | Han | H04N 3/1568 348/308 |
| 2014/0084136 A1* | 3/2014 | Hsieh | H04N 5/2355 250/208.1 |

* cited by examiner

PIXEL SENSING CIRCUIT AND DRIVING METHOD THEREOF, IMAGE SENSOR AND ELECTRONIC DEVICE

CROSS-REFERENCE TO RELATED APPLICATION(S)

This application claims the priority of Chinese Patent Application No. 201811383403.3 filed on Nov. 20, 2018, the entire contents of which are hereby incorporated by reference.

TECHNICAL FIELD

The present disclosure relates to the field of image sensing, and in particular to a pixel sensing circuit and a driving method thereof, an image sensor, and an electronic device.

BACKGROUND

An active pixel sensor (APS) converts an optical signal into an electrical signal. The active pixel sensor may include a charge coupled device (CCD) type APS and a complementary metal oxide semiconductor (CMOS) type APS. The CMOS type APS can be fabricated on a silicon substrate by a semiconductor manufacturing process, so that the CMOS type APS can be easily integrated into a peripheral system having an amplification circuit and a signal processing circuit.

SUMMARY

Embodiments of the present disclosure provide a pixel sensing circuit and a method for driving the same, and an image sensor and an electronic device including the pixel sensing circuit in accordance with the embodiments of the present disclosure.

According to an aspect of the embodiments of the present disclosure, there is provided a pixel sensing circuit, comprising:

a photoelectric conversion sub-circuit electrically coupled to a signal collection point and configured to collect an incident light, and generate an electrical signal based on the incident light collected, so as to charge the signal collection point;

a resetting sub-circuit electrically coupled to a first controlling signal line and a first power supply terminal and configured to write a first power supply voltage from the first power supply terminal to the signal collection point, under a control of a first controlling signal from the first controlling signal line;

a conversion transistor having a control electrode electrically coupled to the signal collection point, a first electrode electrically coupled to a second power supply terminal, and a second electrode, wherein the conversion transistor is configured to output a current signal according to a voltage at the signal collection point;

a compensation and pulling-up sub-circuit electrically coupled to the second electrode of the conversion transistor, a second controlling signal line, a third controlling signal line, a fourth controlling signal line, a second power supply terminal, and a third power supply terminal, wherein the compensation and pulling-up sub-circuit is configured to: obtain a threshold voltage of the conversion transistor under a control of a second controlling signal from the second controlling signal line; generate a compensation voltage according to the threshold voltage; write the compensation voltage to the signal collection point, wherein the compensation voltage $V0$ is given by $V0=VSS+Vth$, VSS refers to the second power supply voltage, and Vth refers to the threshold voltage; and pull up the voltage at the signal collection point, under a control of a third controlling signal from the third controlling signal line and a fourth controlling signal from the fourth controlling signal line, so as to enable the conversion transistor operating in a saturated state; and a selection sub-circuit electrically coupled to the second electrode of the conversion transistor and the third controlling signal line, and configured to output the current signal from the second electrode of the conversion transistor under a control of the third controlling signal.

For example, the compensation and pulling-up sub-circuit comprises a threshold compensation sub-circuit and a pulling-up sub-circuit, wherein the threshold compensation sub-circuit is electrically coupled to the signal collection point, the second electrode of the conversion transistor and the second controlling signal line, and configured to obtain the threshold voltage of the conversion transistor under the control of the second controlling signal, generate the compensation voltage according to the threshold voltage and write the compensation voltage to the signal collection point; and the pulling-up sub-circuit is electrically coupled to the signal collection point, the third controlling signal line, the fourth controlling signal line, the second power supply terminal and the third power supply terminal, and configured to pull up the voltage at the signal collection point from a sampling voltage to a detection voltage, under the control of the third controlling signal and the fourth controlling signal, wherein the sampling voltage is given by $V1=V0+\Delta V$, $\Delta V$ refers to a voltage variation at the signal collection point, and the detection voltage is given by $V2=V1+(V'-VSS-\Delta V)*\alpha$, $V'$ refers to the third power supply voltage, and a is a predetermined constant and $0<\alpha<1$.

For another example, the compensation and pulling-up sub-circuit comprises: a second transistor; wherein the second transistor has a control electrode electrically coupled to the second controlling signal line, a first electrode electrically coupled to the signal collection point and a second electrode electrically coupled to the second electrode of the conversion transistor.

For another example, the pulling-up sub-circuit comprises a third transistor, a fourth transistor, a first capacitor and a second capacitor; wherein the third transistor has a control electrode electrically coupled to the fourth controlling signal line, a first electrode electrically coupled to a first terminal of the first capacitor and a second electrode of the fourth transistor, and a second electrode electrically coupled to the second power supply terminal;

the fourth transistor has a control electrode electrically coupled to the third controlling signal line, a first electrode electrically coupled to the third power supply terminal, and a second electrode electrically coupled to the first terminal of the first capacitor;

the first capacitor has a second terminal electrically coupled to the signal collection point;

the second capacitor has a first terminal electrically coupled to the signal collection point and a second terminal electrically coupled to the second power supply terminal; and $\alpha=c1/(c1+c2)$, wherein c1 and c2 are capacitances of the first capacitor and the second capacitor respectively.

For another example, the resetting sub-circuit comprises: a first transistor having a control electrode electrically coupled to the first controlling signal line, a first electrode electrically coupled to the first power supply terminal, and a second electrode electrically coupled to the signal collection point.

For another example, the selection sub-circuit comprises: a fifth transistor having a control electrode electrically coupled to the third controlling signal line, a first electrode electrically coupled to an image processor, and a second electrode electrically coupled to the second electrode of the conversion transistor.

For another example, the fourth controlling signal line and the second controlling signal line are the same controlling signal line.

According to another aspect of the embodiments of the present disclosure, there is provided an image sensor, comprising the pixel sensing circuit in accordance with the embodiments of the present disclosure; and an image processor.

According to yet another aspect of the embodiments of the present disclosure, there is provided an electronic device, comprising the image sensor in accordance with the embodiments of the present disclosure.

According to still another aspect of the embodiments of the present disclosure, there is provided a method of driving the pixel sensing circuit in accordance with the embodiments of the present disclosure, comprising:

during a first phase, writing, by the resetting sub-circuit, the first power supply voltage to the signal collection point, under the control of the first controlling signal;

during a second phase, obtaining, by the compensation and pulling-up sub-circuit, the threshold voltage of the conversion transistor, under the control of the second controlling signal; generating the compensation voltage according to the threshold voltage; and writing the compensation voltage to the signal collection point;

during a third phase, collecting, by the photoelectric conversion sub-circuit, the incident light, and generating the electrical signal based on the incident light collected, so as to charge the signal collection point;

during a fourth phase, pulling-up, by the compensation and pulling-up sub-circuit, the voltage at the signal collection point, under the control of the third controlling signal and the fourth controlling signal; operating, by the conversion transistor, in the saturated state, and outputting the current signal according to the voltage at the signal collection point; outputting, by the selection sub-circuit, the current signal from the conversion transistor under the control of the third controlling signal.

DETAILED DESCRIPTION

In order to enable a better understanding of the technical solutions of the present disclosure for those skilled in the art, a pixel sensing circuit and a method for driving the same, an image sensor, and an electronic device according to the present disclosure are described in detail below with reference to the accompanying drawings.

Figure 1:
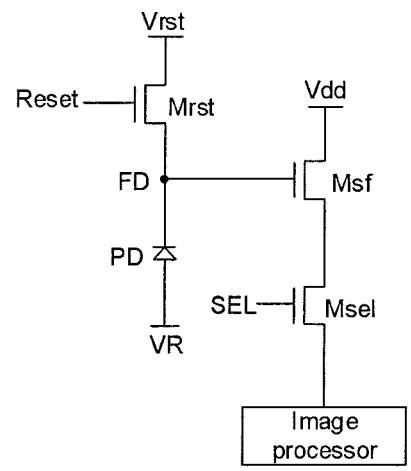
FIG. 1 shows a schematic diagram illustrating a circuit structure of a pixel sensing circuit.

A CMOS image sensor may include a plurality of pixel units (Pixels), and each of the pixel units is provided with a corresponding pixel sensing circuit. FIG. 1 shows a schematic diagram illustrating a circuit structure of a pixel sensing circuit. As shown in FIG. 1, the pixel sensing circuit may include a resetting transistor Mrst, a photodiode PD, a conversion transistor Msf, and a selection transistor Msel, wherein a control electrode of the resetting transistor Mrst, the first terminal of the photodiode PD, and a control electrode of the conversion transistor Msf are coupled to a signal collection point PD. The photodiode PD collects an incident light and generates a corresponding electrical signal based on the incident light collected. The conversion transistor Msf outputs a corresponding current signal according to a voltage signal at the signal collection point PD. The current signal is delivered by the selection transistor Msel to, for example, an external image processor, so as to determine the intensity of the incident light based on the current signal by the external image processor.

Figure 2:
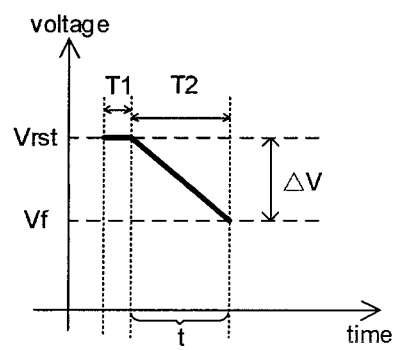
FIG. 2 shows a schematic waveform diagram illustrating a voltage at a signal collection point in FIG. 1 as a function of time.

FIG. 2 shows a schematic waveform diagram illustrating a voltage at a signal collection point in FIG. 1 as a function of time. As shown in FIG. 2, during a resetting phase T1, the resetting transistor Mrst is turned on in response to a control of a resetting signal Reset, and a predetermined resetting voltage Vrst provided by the resetting terminal is written to the signal collection point, so as to reset the voltage at the signal collection point PD.

During an exposure sampling phase T2, the resetting transistor Mrst is turned off, and the photodiode PD collects the incident light to generate a corresponding electrical signal for charging the signal collection point PD. The duration of T2 is represented by t, which can be set by default. The voltage at the signal collection point PD decreases gradually. If it is assumed that the voltage at the photodiode PD is Vf at the end of the exposure sampling phase T2, the voltage variation $\Delta V$ at the signal collection point PD can be expressed by $\Delta V=Vrst-Vf$, the voltage variation $\Delta V$ corresponding to the intensity of the incident light. The conversion transistor Msf operates in a saturated state and outputs a corresponding current signal according to the voltage at the signal collection point PD. The selection transistor Msel is turned on in response to the selection controlling signal SEL, so as to transmit the current signal from the conversion transistor Msf to the external image processor. The image processor can calculate the voltage variation $\Delta V$ at the signal collection point PD during the exposure sampling phase T2, based on the current signal, thereby obtaining the intensity of the incident light.

However, with an increasing usage time, the threshold voltage of the conversion transistor Msf may drift. Thus, even if the voltage at the signal collection point PD is the same, the current from the conversion transistor Msf may be different, causing the output of the conversion transistor Msf not to be in consistent with the optical signal collected accurately.

Figure 3:
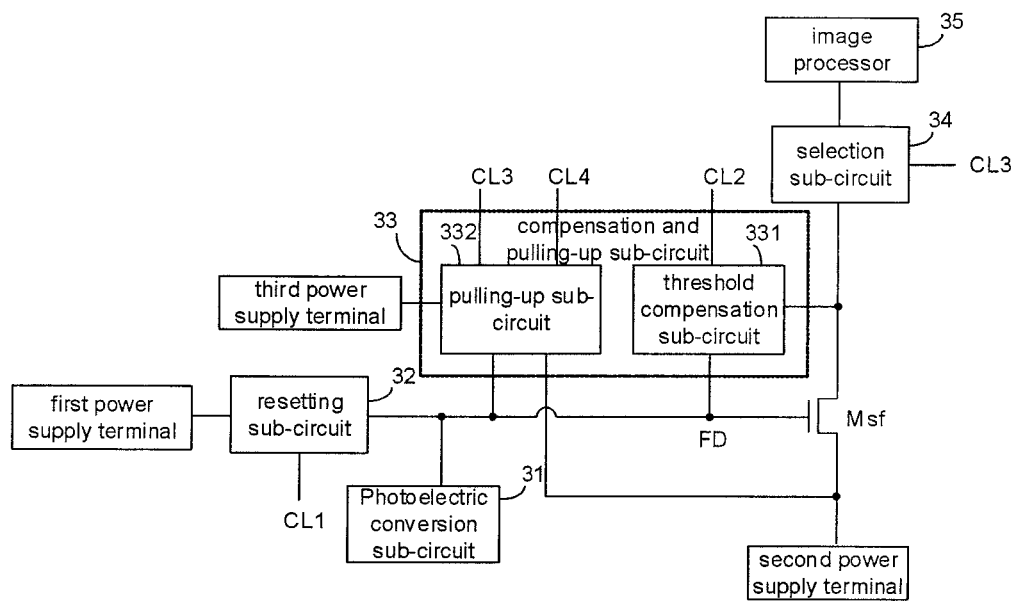
FIG. 3 shows a schematic diagram illustrating the circuit structure of a pixel sensing circuit according to an embodiment of the present disclosure.

FIG. 3 shows a schematic diagram illustrating the circuit structure of a pixel sensing circuit according to an embodiment of the present disclosure. As shown in FIG. 3, the pixel sensing circuit may include a photoelectric conversion sub-circuit 31, a resetting sub-circuit 32, a compensation and pulling-up sub-circuit 33, a selection sub-circuit 34, and a conversion transistor Msf. The photoelectric conversion sub-circuit 31 is electrically coupled to the resetting sub-circuit 32 and a control electrode of the conversion transistor Msf, and the compensation and pulling-up sub-circuit 33 is electrically coupled to the signal collection point PD.

The photoelectric conversion sub-circuit 31 can be configured to collect an incident light, and generate an electrical signal based on the incident light collected, so as to charge the signal collection point PD. In various embodiments of the present disclosure, the description is made by taking the photoelectric conversion sub-circuit comprising a photodiode (PD) as an example, wherein the photodiode PD has an anode electrically coupled to the power supply terminal that supplies the voltage VR, and a cathode electrically coupled to the output terminal of the photoelectric conversion sub-circuit 31. Certainly, the photoelectric conversion sub-circuit in the embodiments of the present disclosure may also be other devices having a photoelectric conversion function.

The resetting sub-circuit 32 is electrically coupled to a first controlling signal line CL1 and a first power supply terminal. The resetting sub-circuit 32 is configured to write a first power supply voltage from the first power supply terminal to the signal collection point PD, under a control of a first controlling signal from the first controlling signal line CL1.

The conversion transistor Msf has a control electrode electrically coupled to the signal collection point, a first electrode electrically coupled to a second power supply terminal, and a second electrode, wherein the conversion transistor is configured to output a current signal according to a voltage at the signal collection point PD.

The compensation and pulling-up sub-circuit 33 is electrically coupled to the second electrode of the conversion transistor Msf, a second controlling signal line CL2, a third controlling signal line CL3, a fourth controlling signal line CL4, a second power supply terminal, and a third power supply terminal. The compensation and pulling-up sub-circuit 33 is configured to obtain a threshold voltage of the conversion transistor Msf under a control of a second controlling signal from the second controlling signal line CL2; generate a compensation voltage according to the threshold voltage; and write the compensation voltage to the signal collection point PD, wherein the compensation voltage V0 is given by V0=VSS+Vth, VSS refers to the second power supply voltage from the second power supply terminal, and Vth refers to the threshold voltage.

Further, the compensation and pulling-up sub-circuit 33 is configured to pull up the voltage at the signal collection point PD, under a control of a third controlling signal from the third controlling signal line CL3 and a fourth controlling signal from the fourth controlling signal line CL4, so as to enable the conversion transistor Msf operating in a saturated state.

The selection sub-circuit 34 is electrically coupled to the second electrode of the conversion transistor Msf and the third controlling signal line CL3, and configured to output the current signal from the second electrode of the conversion transistor Msf under a control of the third controlling signal.

The operation of the pixel sensing circuit according to the embodiment of the present disclosure may include the following four phases: a first phase S1, a second phase S2, a third phase S3, and a fourth phase S4.

During the first phase S1, under the control of the first controlling signal, the resetting sub-circuit 32 writes the first power supply voltage to the signal collection point PD, so as to reset the voltage at the signal collection point PD. Those skilled in the art should understand that the first power supply voltage Vrst from the first power supply terminal should be greater than VSS, so as to enable that the conversion transistor Msf can be turned on when the voltage at the signal collection point PD is Vrst, and prepare for obtaining the threshold voltage of the conversion transistor Msf in the second phase. The selection sub-circuit 34 disconnects the second electrode of the conversion transistor Msf from the image processor 35 under the control of the third controlling signal, so as to prevent the current from the conversion transistor Msf from being outputted to the image processor in the first phase. Thus, the first phase can also be referred as a "resetting phase".

During the second phase S2, the compensation and pulling-up sub-circuit 33 obtains the threshold voltage of the conversion transistor Msf, under the control of the second controlling signal; generates the compensation voltage V0 according to the threshold voltage; and writing the compensation voltage V0 to the signal collection point PD. Thus, the second phase can also be referred as a "threshold compensation phase".

During the third phase S3, the photoelectric conversion sub-circuit 31 collects the incident light and generates the electrical signal, so as to charge the signal collection point PD. In this process, the voltage variation at the signal collection point PD, i.e., the difference between the voltage after being charged and the voltage before being charged is expressed by ΔV. Thus, at the end of the third phase S3, the voltage V1 at the signal collection point PD can be expressed by V1=V0+ΔV=VSS+Vth+ΔV. Therefore, the third phase can be referred to as an "exposure sampling phase." In addition, those skilled in the art can understand that the duration of the third phase S3 can be preset according to actual needs.

During the fourth phase S4, the compensation and pulling-up sub-circuit 33 pulls-up the voltage at the signal collection point PD, under the control of the third controlling signal and the fourth controlling signal, so as to enable the conversion transistor operating in a saturated state. Among the others, if the pulling up amount of the voltage at the signal collection point PD is Vu, the voltage at the signal collection point PD can be expressed by V1+Vu=VSS+Vth+ΔV+Vu. Under the control of the third controlling signal, the selection sub-circuit 34 connects the second electrode of the conversion transistor Msf with the image processor 5, and the second electrode of the conversion transistor Msf outputs a current signal corresponding to the voltage at the signal collection point PD. Therefore, the fourth phase can be referred to as an "outputting phase." The gate-source voltage Vgs of the conversion transistor Msf can be expressed by:

$$Vgs=VSS+Vth+\Delta V+Vu-VSS=Vth+\Delta V+Vu.$$

Thus, it can be obtained according to the saturation driving current equation:

$$\begin{aligned} I &= K*(Vgs-Vth)^2 \\ &= K*(Vth+\Delta V+Vu-Vth)^2 \\ &= K*(\Delta V+Vu)^2 \end{aligned}$$

wherein K is a constant determined by the channel size and electrical characteristics of the conversion transistor Msf. As can be seen from the above equation, the magnitude of the current output from the conversion transistor Msf is related to the voltage variation ΔV at the signal collection point PD, but independent of the threshold voltage Vth of the conversion transistor Msf. Therefore, the pixel sensing circuit according to an embodiment of the present disclosure can alleviate the problem that the outputs of source follower transistors are not uniform due to their own difference.

According to the embodiment of the present disclosure, during the third phase, the charges outputted from the photoelectric conversion sub-circuit may cause a voltage drop at the signal collection point PD. At this time, the conversion transistor Msf may be turned off and does not output the current. In order to enable the conversion transistor Msf outputting the current signal in the fourth phase, during the fourth phase, the voltage at the signal collection point PD should be pulled-up, so as to make the conversion transistor Msf operating in the saturated state.

The compensation and pulling-up circuit 33 may comprise a threshold compensation sub-circuit 331 and a pulling-up sub-circuit 332.

Further, the threshold compensation sub-circuit 331 is electrically coupled to the signal collection point PD, the first electrode of the conversion transistor Msf and the second controlling signal line CL2, and configured to obtain the threshold voltage of the conversion transistor Msf under the control of the second controlling signal, generate the compensation voltage according to the threshold voltage and write the compensation voltage to the signal collection point PD. For example, the threshold compensation sub-circuit 331 may perform above operations during the second phase (threshold compensation phase).

The pulling-up sub-circuit 332 is electrically coupled to the signal collection point PD, the third controlling signal line CL3, the fourth controlling signal line CL4, the second power supply terminal and the third power supply terminal, and configured to pull up the voltage at the signal collection point PD from a sampling voltage to a detection voltage, under the control of the third controlling signal and the fourth controlling signal, wherein the sampling voltage is given by V1=V0+ΔV, ΔV refers to a voltage variation at the signal collection point PD during the exposure sampling phase, and the detection voltage is given by V2=V1+(V'−VSS−ΔV)*α, V' refers to the third power supply voltage, and α is a predetermined constant and 0<α<1. For example, the pulling-up sub-circuit 332 may perform above operations during the fourth phase (outputting phase).

According to the embodiment of the present disclosure, Vu=(V'−VSS−ΔV)*α. Thus, after being pulled up by the pulling-up sub-circuit 332, the voltage at the signal collection point PD can be expressed by VSS+Vth+ΔV+(V'−VSS−ΔV)*α, and the gate-source voltage Vgs of the conversion transistor Msf can be expressed by:

$$Vgs=Vth+\Delta V+(V'-VSS-\Delta V)*\alpha.$$

Thus, it can be obtained according to the saturation driving current equation that:

$$\begin{aligned}I &= K*(Vgs-Vth)^2 \\ &= K*[Vth+\Delta V+(V'-VSS-\Delta V)*\alpha-Vth]^2 \\ &= K*[\Delta V+(V'-VSS-\Delta V)*\alpha]^2\end{aligned}$$

It will be understood by those skilled in the art that the present embodiment describes the case where the voltage at the signal collection point PD is pulled up by Vu=(V'−VSS−ΔV)*α during the fourth stage. This is only an example, and does not limit the embodiments of the present disclosure. There may also be other cases, for example, the pulling-up amount Vu can be a predetermined fixed value.

Figure 4:
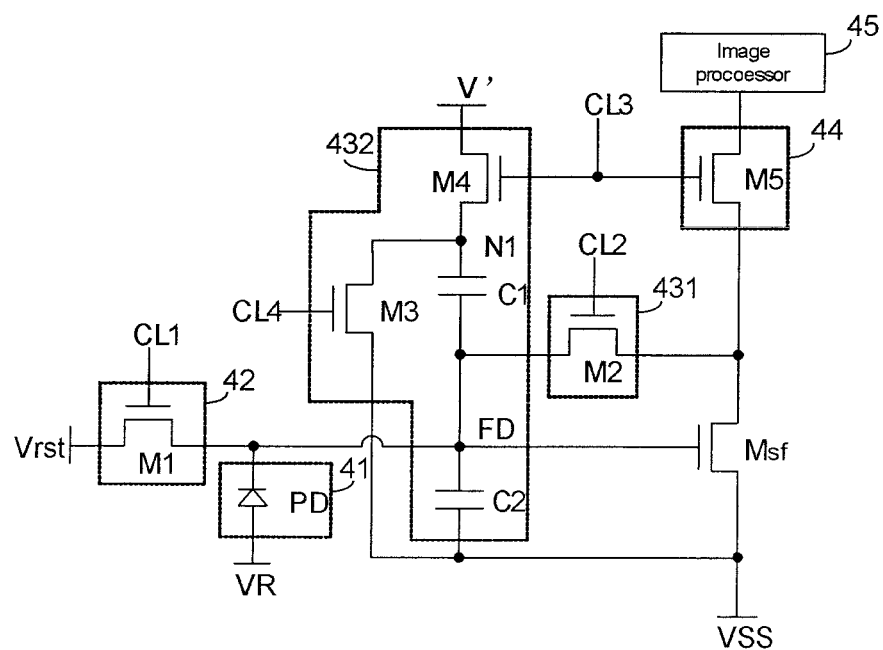
FIG. 4 shows a schematic diagram illustrating the circuit structure of the pixel sensing circuit according to another embodiment of the present disclosure.

FIG. 4 shows a schematic diagram illustrating the circuit structure of the pixel sensing circuit according to another embodiment of the present disclosure.

The threshold compensation sub-circuit 431 may comprise a second transistor M2. The second transistor M2 has a control electrode electrically coupled to the second controlling signal line CL2, a first electrode electrically coupled to the signal collection point PD and a second electrode electrically coupled to the second electrode of the conversion transistor Msf.

The pulling-up sub-circuit 432 may comprise a third transistor M3, a fourth transistor M4, a first capacitor C1 and a second capacitor C2.

The third transistor M3 has a control electrode electrically coupled to the fourth controlling signal line CL4, a first electrode electrically coupled to a first terminal of the first capacitor C1 and a second electrode of the fourth transistor M4, and a second electrode electrically coupled to the second power supply terminal.

The fourth transistor M4 has a control electrode electrically coupled to the third controlling signal line CL3, a first electrode electrically coupled to the third power supply terminal, and a second electrode electrically coupled to the first terminal of the first capacitor C1.

The first capacitor C1 has a second terminal electrically coupled to the signal collection point PD. The second capacitor C2 has a first terminal electrically coupled to the signal collection point PD and a second terminal coupled to the second power supply terminal.

At this time, α=c1/(c1+c2), wherein c1 and c2 are the capacitances of the first capacitor and the second capacitor respectively.

For example, the resetting sub-circuit 42 may include a first transistor M1 having a control electrode electrically coupled to the first controlling signal line CL1, a first electrode coupled to the first power supply terminal and a second electrode electrically coupled to the signal collection point PD.

For example, the selection sub-circuit 44 can include a fifth transistor M5 having a control electrode electrically coupled to the third controlling signal line CL3, a first electrode electrically coupled to the image processor 5, and a second electrode electrically coupled to the second electrode of the conversion transistor Msf.

According to an embodiment of the present disclosure, the first to fifth transistors M1 to M5 are each used as a switching transistor. The switching transistor can include three electrodes: a gate, a source, and a drain, wherein the source and the drain are structurally symmetrical, and thus interchangeable as desired. In the present disclosure, the control electrode refers to the gate of the transistor, one of the first and second electrodes being the source and the other being the drain.

In addition, the transistors can be classified into N-type transistors and P-type transistors depending on their characteristics. For an N-type transistor, the turning-on voltage is at a high level, and the turning-off voltage is at a low level. For a P-type transistor, the turning-on voltage is at a low level, and the turning-off voltage is at a high level.

Hereinafter, the exemplary description is made by taking the first to the fifth transistors M1 to M5 and the conversion transistor Msf all being N-type transistors as an example. The first power supply voltage from the first power supply terminal is Vrst, the second power supply voltage from the second power supply terminal is VSS, and the third power supply voltage from the third power supply terminal is V'.

The operation of the pixel sensing circuit according to the embodiment of the present disclosure will be described in detail below with reference to the accompanying drawings.

Figure 5:
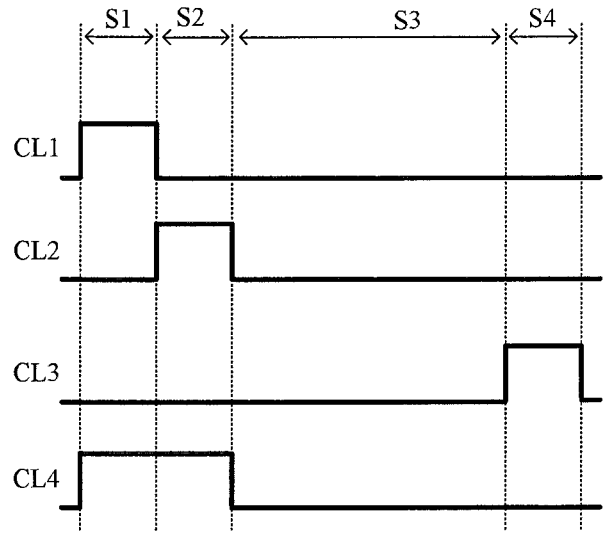
FIG. 5 shows a timing chart for the pixel sensing circuit shown in FIG. 4.

FIG. 5 shows a timing chart for the pixel sensing circuit shown in FIG. 4. As shown in FIG. 5, the operation of the pixel sensing circuit includes the following four phases: a first phase S1, a second phase S2, a third phase S3, and a fourth phase S4.

During the first phase S1, the first controlling signal provided by the first controlling signal line CL1 is at a high level, the second controlling signal provided by the second controlling signal line CL2 is at a low level, the third controlling signal provided by the third controlling signal CL3 is at a low level, and the fourth controlling signal provided by the fourth controlling signal CL4 is at a high level. At this time, the first transistor M1 and the third transistor M3 are both turned on, and the second transistor M2, the fourth transistor M4 and the fifth transistor M5 are all turned off.

Since the first transistor M1 is turned on, the first power supply voltage Vrst can be written to the signal collection point PD through the first transistor M1, so as to reset the voltage at the signal collection point PD. In addition, since the third transistor M3 is turned on, the second power supply voltage VSS can be written to a first node N1 through the third transistor M3, such that the voltage at the first node N1 is VSS.

Those skilled in the art should understand that in the process of resetting the voltage at the signal collection point PD, the conversion transistor may output the current. However, since the fifth transistor M5 is turned off, the current will not be outputted to the image processor 45, thereby preventing a false detection.

During the second phase S2, the first controlling signal provided by the first controlling signal line CL1 is at a low level, the second controlling signal provided by the second controlling signal line CL2 is at a high level, the third controlling signal provided by the third controlling signal CL3 is at a low level, and the fourth controlling signal provided by the fourth controlling signal CL4 is at a high level. At this time, the second transistor M2 and the third transistor M3 are both turned on, and the first transistor M1, the fourth transistor M4 and the fifth transistor M5 are all turned off.

Since the second transistor M2 is turned on, the current from the conversion transistor Msf will charge the signal collection point PD through the second transistor M2. When the voltage at the signal collection point PD is VSS+Vth, the conversion transistor Msf is turned off and the charging process ends. At the same time, the third transistor M3 maintains in a turned on state, thus the voltage at the first node maintains at VSS.

During the third phase S3, the first controlling signal provided by the first controlling signal line CL1 is at a low level, the second controlling signal provided by the second controlling signal line CL2 is at a low level, the third controlling signal provided by the third controlling signal CL3 is at a low level, and the fourth controlling signal provided by the fourth controlling signal CL4 is at a low level. At this time, the first transistor M1, the second transistor M2, the third transistor M3, the fourth transistor M4 and the fifth transistor M5 are all turned off.

The photoelectric conversion sub-circuit 41 collects the incident light and generates the electric charge, and charges the signal collection point PD. In this process, it is assumed that the voltage variation at the signal collection point PD, (the difference between the voltage after being charged and the voltage before being charged) is $\Delta V$, at the end of the third phase S3, the voltage at the signal collection point PD is VSS+Vth+$\Delta V$.

In the changing of the voltage at the signal collection point PD, since the first node N1 is in a floating state, the voltage at the first node is hopped from VSS to VSS+$\Delta V$, due to the bootstrap function of the first capacitor C1.

During the fourth phase S4, the first controlling signal provided by the first controlling signal line CL1 is at a low level, the second controlling signal provided by the second controlling signal line CL2 is at a low level, the third controlling signal provided by the third controlling signal CL3 is at a high level, and the fourth controlling signal provided by the fourth controlling signal CL4 is at a low level. At this time, the fourth transistor M4 and the fifth transistor M5 are both turned on, and the first transistor M1, the second transistor M2 and the third transistor M3 are all turned off.

Since the fourth transistor M4 is turned on, the third power supply voltage V' is written to the first node N1 by the fourth transistor M4, i.e., the voltage at the first node N1 is changed from VSS+$\Delta V$ to V'. Meanwhile, since the signal collection point PD is in the floating state, the voltage at the signal collection point PD is pulled up from VSS+Vth+$\Delta V$ to VSS+Vth+$\Delta V$+(V'−VSS−$\Delta V$)*c1/(c1+c2) due to the bootstrap function of the first capacitor C1 and the voltage sharing of the first capacitor C1 and the second capacitor C2.

At this time, the gate-source voltage Vgs of the conversion transistor can be expressed by:

$$Vgs=Vth+\Delta V+(V'-VSS-\Delta V)*c/(c1+c2).$$

Thus, it can be obtained according to the saturation driving current equation that:

$$\begin{aligned}I &= K*(Vgs-Vth)^2 \\ &= K*[Vth+\Delta V+(V'-VSS-\Delta V)*c1/(c1+c2)-Vth]^2 \\ &= K*[\Delta V+(V'-VSS-\Delta V)*c1/(c1+c2)]^2\end{aligned}$$

Thus, the magnitude of the current output from the conversion transistor Msf is related to the voltage variation $\Delta V$ at the signal collection point PD, the second power supply voltage VSS, the third power supply voltage V', the capacitance c1 of the first capacitor C1, and the capacitance c2 of the second capacitor C2, but independent of the threshold voltage Vth of the conversion transistor Msf. Therefore, the pixel sensing circuit according to an embodiment of the present disclosure can alleviate the problem that the outputs of source follower transistors are not uniform due to their own difference.

In practical applications, the second power supply voltage VSS, the third power supply voltage V', the capacitance c1 of the first capacitor C1 and the capacitance c2 of the second capacitor C2 can be designed, thereby controlling the pulling-up amount of the voltage at the signal collection point PD during the fourth phase.

For example, the fourth controlling signal line CL4 and the second controlling signal line CL2 may be the same controlling signal line. At this time, the fourth controlling signal line CL4 carries the second controlling signal. By this means, the number of the controlling signal lines required for the pixel sensing circuit can be reduced. It should be noted that the third transistor M3 is only turned on during the second phase but not turned on during the first phase when the fourth controlling signal line CL4 and the second controlling signal line CL2 are the same controlling signal line.

For example, the third power supply terminal and the first power supply terminal are the same power supply terminal, that is, the third power supply voltage V' provided by the third power supply terminal can be expressed by V'=Vrst. By this means, the number of the power supply terminals required for the pixel sensing circuit can be reduced.

It can be understood by those skilled in the art that each of the above transistors is an N-type transistor. In this case, the above transistors can be simultaneously prepared by using a transistor fabrication process once. However, the present disclosure is not limited thereto. In the embodiment of the present disclosure, each transistor can also be selectively replaced with a P-type transistor, which will not be described in detail herein.

Figure 6:
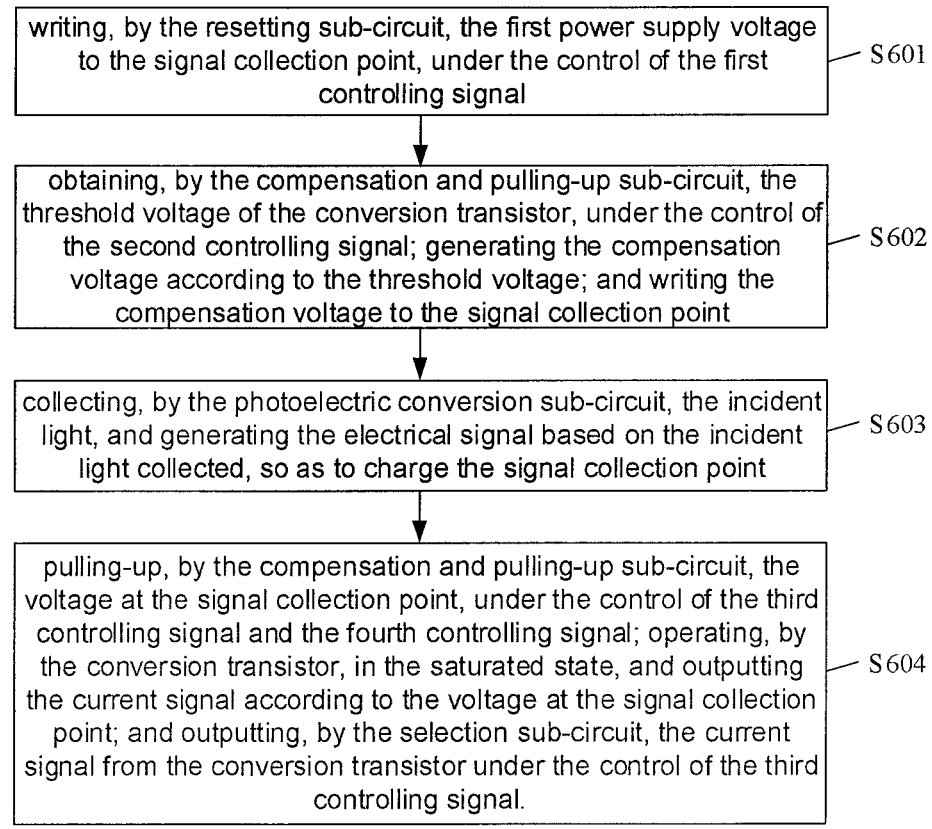
FIG. 6 shows a flow chart illustrating a method for driving the pixel sensing circuit according to an embodiment of the present disclosure.

FIG. 6 shows a flow chart illustrating a method for driving the pixel sensing circuit according to an embodiment of the present disclosure. The pixel sensing circuit shown in FIG. 6 may be the pixel sensing circuit according to any of the above embodiments, and the method may include following steps.

In step S601, the resetting sub-circuit writes the first power supply voltage to the signal collection point, under the control of the first controlling signal.

In step S602, the compensation and pulling-up sub-circuit obtains the threshold voltage of the conversion transistor, under the control of the second controlling signal; generates the compensation voltage according to the threshold voltage; and writes the compensation voltage to the signal collection point.

In step S603, the photoelectric conversion sub-circuit collects the incident light, and generates the electrical signal based on the incident light collected, so as to charge the signal collection point.

In step S604, the compensation and pulling-up sub-circuit pulls-up the voltage at the signal collection point, under the control of the third controlling signal and the fourth controlling signal. The conversion transistor operates in the saturated state, and outputs the current signal according to the voltage at the signal collection point. The selection sub-circuit outputs the current signal from the conversion transistor under the control of the third controlling signal.

The detailed description of the foregoing steps S601 to S604 can refer to the corresponding content in the foregoing embodiment, and thus, details are not described herein again.

An embodiment of the present disclosure also provides an image sensor, comprising the pixel sensing circuit in accordance with the above embodiments; and the image processor.

The image sensor may further include peripheral circuits such as a row driving circuit, a column driving circuit, an amplifying circuit, and a preprocessing circuit. The pixel unit array and the peripheral circuit may be formed on a silicon substrate, for example, by a semiconductor integrated circuit fabrication process (for example, a CMOS integrated circuit fabrication process), wherein the silicon substrate may be, for example, a single crystal silicon substrate or a silicon-on-insulator (SOI) substrate, and the like.

Embodiments of the present disclosure also provide an electronic device including the image sensor in accordance with the embodiments of the present disclosure. The electronic device can be a digital camera, a mobile phone, a tablet, a laptop, or the like.

It is to be understood that the above embodiments are merely exemplary embodiments employed to explain the principles of the present disclosure, but not limit the present disclosure. Various modifications and improvements can be made by those skilled in the art without departing from the spirit and scope of the disclosure, and such modifications and improvements are also considered to be within the scope of the disclosure.

I claim:

1. A pixel sensing circuit, comprising:
   a photoelectric conversion sub-circuit electrically coupled to a signal collection point and configured to collect an incident light, and generate an electrical signal based on the incident light collected, so as to charge the signal collection point;
   a resetting sub-circuit electrically coupled to a first controlling signal line and a first power supply terminal and configured to write a first power supply voltage from the first power supply terminal to the signal collection point, under a control of a first controlling signal from the first controlling signal line;
   a conversion transistor having a control electrode electrically coupled to the signal collection point, a first electrode electrically coupled to a second power supply terminal, and a second electrode, wherein the conversion transistor is configured to output a current signal according to a voltage at the signal collection point;
   a compensation and pulling-up sub-circuit electrically coupled to the second electrode of the conversion transistor, a second controlling signal line, a third controlling signal line, a fourth controlling signal line, a second power supply terminal, and a third power supply terminal, wherein the compensation and pulling-up sub-circuit is configured to:
      obtain a threshold voltage of the conversion transistor under a control of a second controlling signal from the second controlling signal line;
      generate a compensation voltage according to the threshold voltage;
      write the compensation voltage to the signal collection point, wherein the compensation voltage V0 is given by V0=VSS+Vth, VSS refers to a second power supply voltage, and Vth refers to the threshold voltage; and
      pull up the voltage at the signal collection point, under a control of a third controlling signal from the third controlling signal line and a fourth controlling signal from the fourth controlling signal line, so as to enable the conversion transistor to operate in a saturated state; and
   a selection sub-circuit electrically coupled to the second electrode of the conversion transistor and the third controlling signal line, and configured to output the current signal from the second electrode of the conversion transistor under the control of the third controlling signal.

2. The pixel sensing circuit of claim 1, wherein the compensation and pulling-up sub-circuit comprises a threshold compensation sub-circuit and a pulling-up sub-circuit, wherein the threshold compensation sub-circuit is electrically coupled to the signal collection point, the second electrode of the conversion transistor and the second controlling signal line, and configured to obtain the threshold voltage of the conversion transistor under the control of the second controlling signal, generate the compensation voltage according to the threshold voltage and write the compensation voltage to the signal collection point; and the pulling-up sub-circuit is electrically coupled to the signal collection point, the third controlling signal line, the fourth controlling signal line, the second power supply terminal and the third power supply terminal, and configured to pull up the voltage at the signal collection point from a sampling voltage to a detection voltage, under the control of the third controlling signal and the fourth controlling signal, wherein the sampling voltage is given by $V1=V0+\Delta V$, $\Delta V$ refers to a voltage variation at the signal collection point, and the detection voltage is given by $V2=V1+(V'-VSS-\Delta V)*\alpha$, $V'$ refers to a third power supply voltage, and $\alpha$ is a predetermined constant and $0<\alpha<1$.

3. The pixel sensing circuit of claim 2, wherein the compensation and pulling-up sub-circuit comprises: a second transistor;

wherein the second transistor has a control electrode electrically coupled to the second controlling signal line, a first electrode electrically coupled to the signal collection point and a second electrode electrically coupled to the second electrode of the conversion transistor.

4. The pixel sensing circuit of claim 2, wherein the pulling-up sub-circuit comprises a third transistor, a fourth transistor, a first capacitor and a second capacitor;

wherein the third transistor has a control electrode electrically coupled to the fourth controlling signal line, a first electrode electrically coupled to a first terminal of the first capacitor and a second electrode of the fourth transistor, and a second electrode electrically coupled to the second power supply terminal;

the fourth transistor has a control electrode electrically coupled to the third controlling signal line, a first electrode electrically coupled to the third power supply terminal, and a second electrode electrically coupled to the first terminal of the first capacitor;

the first capacitor has a second terminal electrically coupled to the signal collection point;

the second capacitor has a first terminal electrically coupled to the signal collection point and a second terminal electrically coupled to the second power supply terminal; and $\alpha=c1/(c1+c2)$, wherein c1 and c2 are capacitances of the first capacitor and the second capacitor respectively.

5. The pixel sensing circuit of claim 1, wherein the resetting sub-circuit comprises: a first transistor having a control electrode electrically coupled to the first controlling signal line, a first electrode electrically coupled to the first power supply terminal, and a second electrode electrically coupled to the signal collection point.

6. The pixel sensing circuit of claim 1, wherein the selection sub-circuit comprises: a fifth transistor having a control electrode electrically coupled to the third controlling signal line, a first electrode electrically coupled to an image processor, and a second electrode electrically coupled to the second electrode of the conversion transistor.

7. The pixel sensing circuit of claim 1, wherein the fourth controlling signal line and the second controlling signal line are the same controlling signal line.

8. An image sensor, comprising:
the pixel sensing circuit of claim 1; and
an image processor.

9. An electronic device, comprising the image sensor of claim 8.

10. A method of driving the pixel sensing circuit of claim 1, comprising:
during a first phase,
writing, by the resetting sub-circuit, the first power supply voltage to the signal collection point, under the control of the first controlling signal;
during a second phase,
obtaining, by the compensation and pulling-up sub-circuit, the threshold voltage of the conversion transistor, under the control of the second controlling signal; generating the compensation voltage according to the threshold voltage; and writing the compensation voltage to the signal collection point;
during a third phase,
collecting, by the photoelectric conversion sub-circuit, the incident light, and generating the electrical signal based on the incident light collected, so as to charge the signal collection point;
during a fourth phase,
pulling-up, by the compensation and pulling-up sub-circuit, the voltage at the signal collection point, under the control of the third controlling signal and the fourth controlling signal;
operating, by the conversion transistor, in the saturated state, and outputting the current signal according to the voltage at the signal collection point;
outputting, by the selection sub-circuit, the current signal from the conversion transistor under the control of the third controlling signal.

* * * * *